(12) United States Patent
de Jong et al.

(10) Patent No.: US 7,002,219 B1
(45) Date of Patent: Feb. 21, 2006

(54) ELECTRICAL FUSE FOR INTEGRATED CIRCUITS

(75) Inventors: Jan L. de Jong, Cupertino, CA (US); James Karp, Saratoga, CA (US); Leon Ly Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/732,131

(22) Filed: Dec. 9, 2003

(51) Int. Cl.
*H01L 23/62* (2006.01)
*H01L 31/0392* (2006.01)

(52) U.S. Cl. .................... 257/357; 257/358; 257/359; 257/360; 327/525; 327/526; 365/96; 365/225.7

(58) Field of Classification Search ........ 257/357–360, 257/380, 529, 209; 438/128, 129, 132, 215, 438/281, 333, 467, 601; 361/101, 138, 642, 361/643; 327/525–526; 365/96, 225.7 365/200, 104, 177
See application file for complete search history.

(56) References Cited

U.S. PATENT DOCUMENTS

| | | | |
|---|---|---|---|
| 4,987,464 A * | 1/1991 | Fukuda et al. ............... | 257/358 |
| 5,565,790 A * | 10/1996 | Lee .............................. | 326/30 |
| 6,496,416 B1 | 12/2002 | Look | |
| 6,774,438 B1 * | 8/2004 | Arai et al. ................... | 257/358 |
| 2002/0050617 A1 * | 5/2002 | Kato ........................... | 257/360 |

* cited by examiner

*Primary Examiner*—Jerome Jackson
*Assistant Examiner*—Joseph Nguyen
(74) *Attorney, Agent, or Firm*—John Kubodera; LeRoy D. Maunu; Justin Liu

(57) ABSTRACT

An electrically programmable fuse includes a metal-oxide-semiconductor (MOS) programmable transistor that is gate-source coupled by a resistive element. The resistive element can comprise a gate-source coupled MOS transistor. If the MOS transistor is unprogrammed, then the resistive element ensures that the programmable transistor is turned off during read operations. However, when a programming voltage is applied across the source and drain terminals of the programmable transistor, the resistive element allows the programming voltage to be capacitively coupled to the gate of the programmable transistor from its drain. This turns the programmable transistor on, thereby reducing the snapback voltage of the programmable transistor, and hence, the required programming voltage. Once the snapback mode is entered, current flow through the programmable transistor increases until thermal breakdown occurs and the programmable transistor shorts out. The programmable transistor will then behave as a constant-on transistor during all subsequent read operations.

22 Claims, 3 Drawing Sheets

ELECTRICAL FUSE FOR INTEGRATED CIRCUITS

BACKGROUND OF THE INVENTION

1. Field of the Invention

The invention relates to programmable integrated circuits, and in particular, to an electrically programmable fuse.

2. Related Art

It is often beneficial for an integrated circuit (IC) to include one or more one-time programmable elements (fuses). For example, static random access memories (SRAMs) often include metal fuses that can be blown open with a laser to activate redundancy circuitry, thereby improving production yields. As another example, programmable logic devices (PLDs), such as a field programmable gate array (FPGA), may also include fuses for activating redundant resources, storing encryption or security keys, or other purposes. A PLD may include configurable resources, such as configurable logic, a configurable interconnect structure, programmable input/output blocks, memories, transceivers, and processors. Fuses in a PLD may be used to control some or all of the configurable resources.

However, since an external programming tool (e.g., a laser) can sometimes be cumbersome, it is often desirable for fuses to be electrically programmable. An electrically programmable fuse is typically a device that undergoes a permanent change in electrical characteristics in response to a high voltage or current.

For example, commonly owned U.S. Pat. No. 6,496,416, issued Dec. 17, 2002 to Kevin T. Look, describes a metal-oxide-semiconductor (MOS) device that includes a gate heating element. When a programming voltage is applied across the gate heating element, the gate heating element raises the temperature of the device in the channel region, which results in dopant migration. This dopant migration changes the threshold voltage of the device, thereby allowing programmed and unprogrammed devices to be differentiated.

Because this type of electrically programmable fuse can be formed using standard CMOS process steps, it can be readily integrated into an IC. However, the high temperature provided by the gate heating element can sometimes cause a break in the gate heating element prior to sufficient dopant migration to program the fuse. Reducing the temperature of the gate heating element to prevent this failure can slow dopant migration significantly, which in turn increases both the time required for programming the fuse and the testing costs for the IC that includes the fuse.

Accordingly, it is desirable to provide a reliable fuse that can be efficiently programmed, and that can be manufactured using standard metal-oxide-semiconductor (MOS) transistor structures and semiconductor processes.

SUMMARY OF THE INVENTION

According to an embodiment of the invention, an electrically programmable fuse is formed by coupling a regulating element between the source and gate of a programmable transistor for lowering snapback voltage of the transistor below its nominal snapback voltage. According to an embodiment of the invention, the programmable transistor comprises a first n-type metal-oxide-semiconductor (NMOS) transistor, in which case the regulating element can comprise a resistive element such as a second NMOS transistor. The gate of the first NMOS (programmable) transistor is connected to the drain of the second (regulating element) NMOS transistor, while the source of the first transistor, the source of the second transistor, and the gate of the second transistor are all connected to ground. Implementing the regulating element using a transistor can beneficially reduce the layout area requirements of the fuse.

According to another embodiment of the invention, the programmable transistor comprises a first p-type metal-oxide-semiconductor (PMOS) transistor, in which case the regulating element can comprise a second PMOS transistor. The gate of the first PMOS transistor is connected to the drain of the second PMOS transistor, while the source of the first PMOS transistor, the source of the second PMOS transistor, and the gate of the second PMOS transistor are commonly coupled. Once again, implementing the regulating element as a transistor can beneficially reduce the layout area requirements for the fuse.

If the programmable transistor is unprogrammed, the regulating element keeps the source and gate of the programmable transistor at essentially the same voltage, thereby ensuring that a minimal current flows when a read voltage is applied across the programmable transistor (i.e., the programmable transistor remains essentially turned off). Typically, the read voltage is the nominal operating voltage of the programmable transistor (e.g., the voltage for which the programmable transistor was designed).

The programmable transistor can be "blown" (programmed) by applying an elevated programming voltage across the programmable transistor. The programming voltage must be large enough to place the programmable transistor in snapback mode. Once the programmable transistor enters snapback mode, the current flow through the programmable transistor will rapidly increase until thermal breakdown of the programmable transistor occurs. This shorts out the programmable transistor, so that any subsequent read operations will detect the programmable transistor as being turned on.

During the programming operation, the regulating element causes the programmable transistor to turn on slightly, thereby reducing the magnitude of the required programming voltage. Specifically, the resistive element allows a gate-source voltage differential to be created due to capacitive coupling between the drain and gate of the programmable transistor. This gate-source voltage differential turns on the programmable transistor slightly, which reduces the snapback voltage of the programmable transistor (i.e., the drain-source voltage required to place the programmable transistor in snapback mode).

The invention will be more fully understood in view of the following description of the exemplary embodiments and the drawings thereof.

DETAILED DESCRIPTION

Figure 1A:
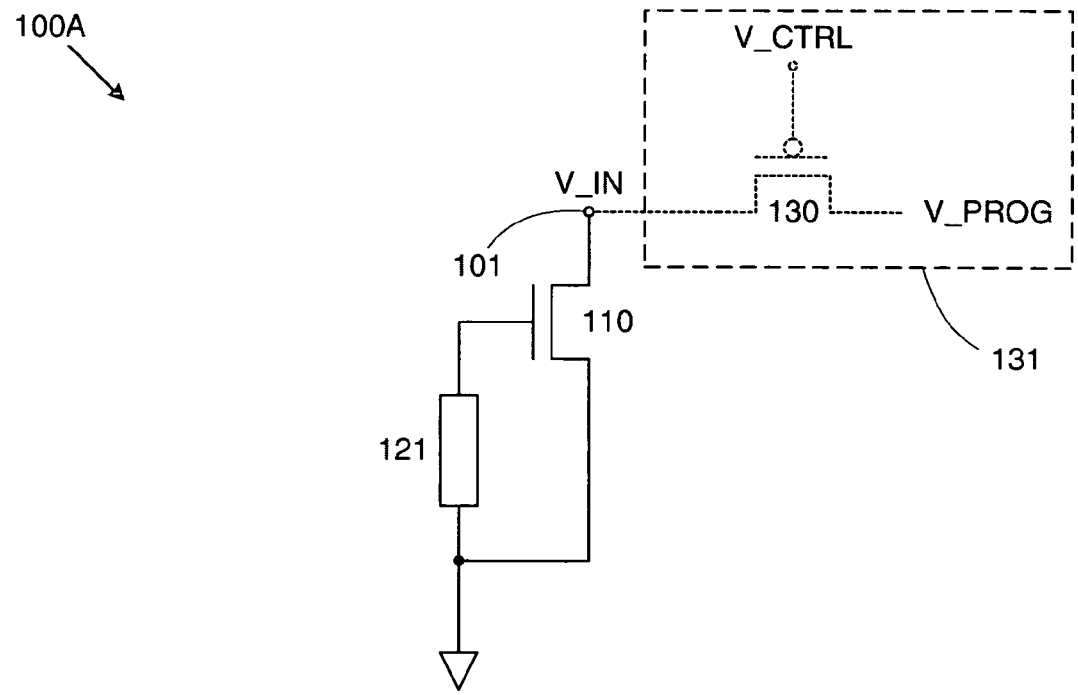
FIGS. 1A and 1B are schematic diagrams of an electrically programmable fuse in accordance with embodiments of the invention.

FIG. 1A shows an electrically programmable fuse 100A in accordance with an embodiment of the invention. Fuse 100A includes an NMOS programmable transistor 110 and a resistive element 121. Resistive element 121 can comprise any structure or device that provides a desired resistance (e.g., a polysilicon resistor). The drain of programmable transistor 110 is connected to an input terminal 101, while the source of programmable transistor 110 is connected to ground. (Note that as used herein, "ground" refers to the lower supply voltage of the circuit that includes the fuse of the invention.)

Meanwhile, resistive element 121 is connected between the gate and source of programmable transistor 110, thereby coupling the gate of programmable transistor 110 to ground. As a result, when fuse 100A is in an unprogrammed state, programmable transistor 110 is essentially off—i.e., when an input voltage V_IN at input terminal 101 is equal to a read voltage (typically the nominal operating voltage of transistor 110), the resulting read current will be negligible.

However, when input voltage V_IN is equal to a programming voltage that is sufficiently greater than the nominal operating voltage of programmable transistor 110 (typically the upper supply voltage VDD of the IC that includes fuse 100A), programmable transistor 110 enters its snapback mode and its current flow increases dramatically. This increasing current flow heats up transistor 110 until thermal breakdown occurs and transistor 110 is shorted (i.e., transistor 110 remains on regardless of its gate voltage). Any subsequent read operations will result in a large read current flow through transistor 110.

By coupling the gate of programmable transistor 110 to ground by resistive element 121, the invention reduces the programming voltage required to place transistor 110 into its snapback mode. As is known in the art, as the gate voltage of an NMOS transistor increases, its snapback voltage (i.e., the drain-source voltage at which the transistor enters its snapback mode) decreases.

Figure 2:
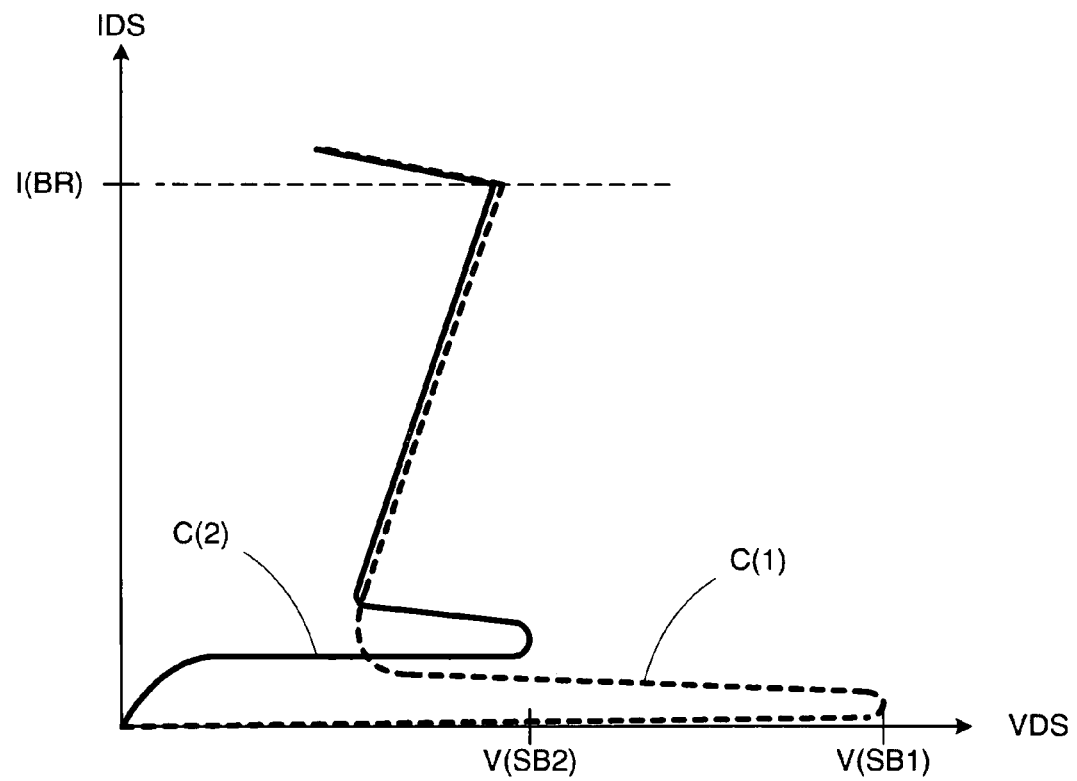
FIG. 2 is a graph of current-voltage curves for grounded gate and active gate MOS transistors.

FIG. 2 shows a graph of sample current (drain-source current IDS) versus voltage (drain-source voltage VDS) response curves for a typical NMOS transistor (e.g., programmable transistor 110 shown in FIG. 1A). Curve C(1) (dotted line) represents a typical response curve that could be generated when the gate and source of the NMOS transistor are connected directly to ground (i.e., "grounded-gate" configuration). Curve C(2) (solid line) represents a typical response curve that would be generated when the gate of the NMOS transistor is raised above ground (i.e., "active-gate" configuration).

As indicated by curve C(1), the current flow through a grounded-gate NMOS transistor is minimal until a nominal snapback voltage V(SB1) is reached. At this point, transistor 110 enters its snapback mode, and current flow increases rapidly. When the current reaches a breakdown current I(BR), thermal breakdown occurs and transistor 110 is shorted. Thus, a grounded-gate NMOS transistor remains off until nominal snapback voltage V(SB1) is reached. Note that in general, the nominal snapback voltage of a MOS transistor is the drain-source voltage at which the MOS transistor enters snapback mode when the gate and source of the transistor are held at the same voltage.

In contrast, as indicated by curve C(2), an active-gate NMOS transistor exhibits current flow before its active-gate snapback voltage V(SB2) is reached. At this point, the active-gate NMOS transistor enters its snapback mode, and the current flow through the transistor increases rapidly until thermal breakdown occurs at breakdown current I(BR). Note that active-gate snapback voltage V(SB2) is significantly lower than grounded-gate snapback voltage V(SB1). As is known in the art, even if a transistor is barely turned on, its (active-gate) snapback voltage will be significantly lower than its grounded-gate snapback voltage.

Returning to FIG. 1A, because the gate of programmable transistor 110 is coupled to ground by resistive element 121, transistor 110 behaves like an active-gate transistor during programming. Specifically, resistive element 121 allows capacitive coupling between the source and gate of transistor 110 to generate an elevated gate voltage for transistor 110, thereby turning on transistor 110. The larger the resistance of resistive element 121, the larger the resulting gate voltage, and the lower the programming voltage must be to place transistor 110 in snapback mode. In this manner, resistive element 121 acts as a regulating element that lowers the snapback voltage of programmable transistor 110 relative to the nominal (grounded-gate) snapback voltage of programmable transistor 110.

Note that according to an embodiment of the invention, an appropriate programming voltage V_PROG can be provided to input terminal 101 of fuse 100 via an optional high-voltage control transistor 130 (indicated by the dotted line). When a control signal V_CTRL is asserted (LOW) at the gate of control transistor 130, input terminal 101 is connected to programming voltage V_PROG and programmable transistor 110 is "blown" (i.e., shorted). Note further that according to another embodiment of the invention, control transistor 130 can be part of an optional control circuit 131 (indicated by the dashed line) that selectably applies either the read voltage or programming voltage to input terminal 101.

According to an embodiment of the invention, programmable transistor 110 can be a "high performance" transistor (i.e., a transistor with a short channel length and thin gate oxide), while control transistor 130 can be a "high voltage" transistor (i.e., a transistor having operating voltage and current limits that are at least double those of a high performance transistor), thereby ensuring that the elevated programming voltage only affects programmable transistor 110. For example, for a 1.2V process, programmable transistor 110 may have a gate aspect ratio (width/length) of 0.5 um/0.08 um while control transistor 130 may have a gate aspect ratio of 40 um/0.24 um. A 3.3V programming voltage will then push programmable transistor 110 into snapback mode without doing the same for control transistor 130, and the resulting high current flow that shorts out (programs) transistor 110 will not reach the breakdown current level of transistor 130.

Figure 1B:
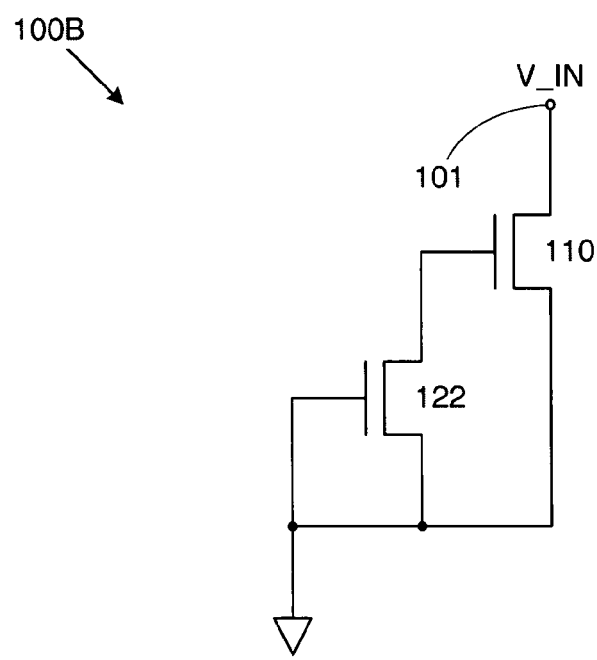

FIG. 1B shows an electrically programmable fuse 100B in accordance with another embodiment of the invention. Fuse 100B is substantially similar to fuse 100A shown in FIG. 1A, with resistive element 121 of fuse 100A being implemented as a grounded-gate NMOS transistor 122 in fuse 100B. Grounded-gate transistor 122 provides a very high resistance path (e.g., in the mega-Ohm range) between the gate of programmable transistor 110 and ground. Typically, grounded gate transistor 122 can be implemented much more easily and efficiently than a conventional semiconductor resistor, and therefore can reduce the cost and space requirements of fuse 100B.

Fuse 100B operates in a manner substantially similar to that described with respect to fuse 100A. Transistor 122 weakly grounds the gate of programmable transistor 110 to ensure that a low read current is maintained while transistor 110 is unprogrammed. The application of an elevated programming voltage to input terminal 101 results in capacitive coupling between the drain and gate of transistor 110. Due to the high resistance of grounded-gate transistor 122, this capacitive coupling results in a gate voltage that is greater than ground, which begins to turn on transistor 110. Consequently, the snap-back voltage of transistor 110 is reduced, thereby ensuring that transistor 110 is placed in snapback mode by the programming voltage and eventually "blows". Once programmed in this manner, transistor 110 provides a high read current at input terminal 101.

Figure 3A:
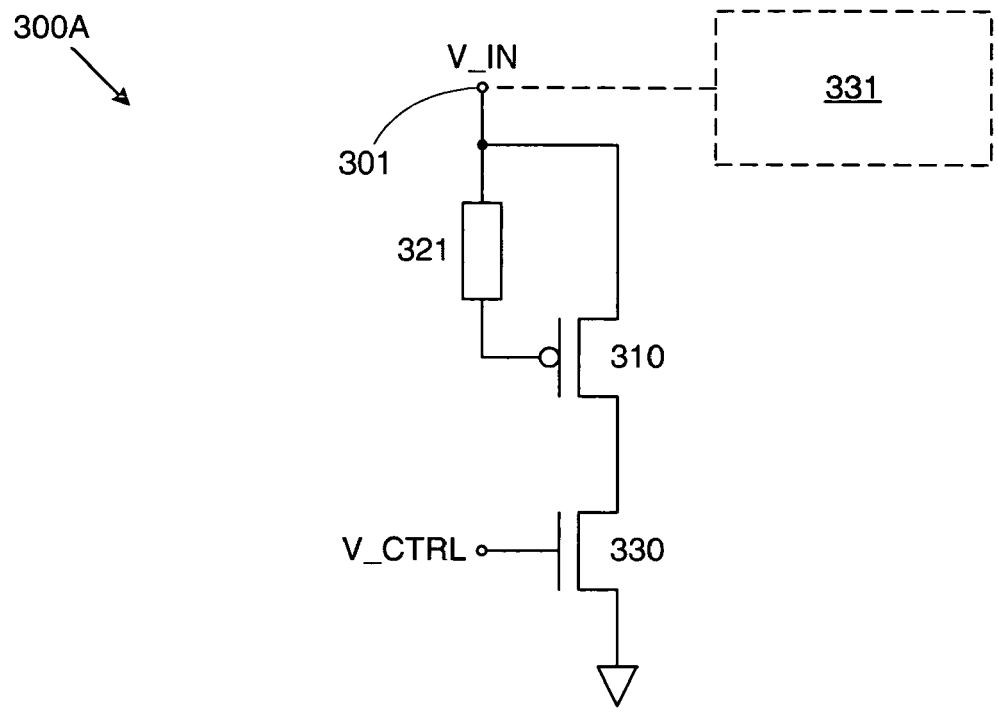
FIGS. 3A and 3B are schematic diagrams of an electrically programmable fuse in accordance with various other embodiments of the invention.

FIG. 3A shows an electrically programmable fuse 300A in accordance with another embodiment of the invention. Fuse 300A includes a PMOS programmable transistor 310 and a resistive element 321. Resistive element 321 can comprise any structure or device that provides a desired resistance (e.g., a polysilicon resistor). The source of programmable transistor 310 is connected to a high voltage input terminal 301, while the drain of transistor 310 is coupled to ground by an NMOS control transistor 330. Meanwhile, resistive element 321 is connected between the gate and source of programmable transistor 310, thereby coupling the gate of programmable transistor 310 to input terminal 301.

To perform a read operation, a control signal V_CTRL is asserted (HIGH) at the gate of control transistor 330 to complete the fuse circuit, and an input voltage V_IN provided at input terminal 301 is set equal to the nominal operating voltage of programmable transistor 310 (e.g., the upper supply voltage VDD). If transistor 310 is in an unprogrammed state, the read voltage provided to its gate by resistive element 321 ensures that transistor 310 is always off—i.e., the read current is negligible.

To program fuse 300A, control transistor 330 is turned on, and input voltage V_IN at input terminal 301 is set equal to an elevated programming voltage, which causes programmable transistor 310 to enter its snapback mode. Note that according to an embodiment of the invention, the read and programming voltages can be selectably provided to input terminal 301 by an optional control circuit 331. Once transistor 310 enters its snapback mode, the current flow through transistor 310 increases rapidly. When this current flow reaches the thermal breakdown current of transistor 310, transistor 310 is permanently shorted. Any subsequent read operations will result in a large read current flow through transistor 310.

Note that for reasons similar to those described with respect to fuse 100A in FIG. 1A, coupling the gate of transistor 310 to input terminal 301 via resistive element 321 allows capacitive coupling between the drain and gate of transistor 310 to turn on transistor 310 during programming. Specifically, the low voltage at the drain of transistor 310 is capacitively coupled to the gate of transistor 310, which drops the gate voltage of transistor 310 below the programming voltage provided at input terminal 301. As a result, transistor 310 is turned on, which in turn reduces its snapback voltage (as described with respect to FIG. 2). Once again, resistive element 321 acts as a regulating element that lowers the snapback voltage of programmable transistor 310 below the nominal snapback voltage of transistor 310, thereby minimizing the required programming voltage for fuse 300A.

According to an embodiment of the invention, programmable transistor 310 can be a high performance transistor, while control transistor 330 can be a high voltage transistor, thereby ensuring that the elevated programming voltage only affects programmable transistor 310. For example, for a 1.2V process, programmable transistor 310 may have a gate aspect ratio of 0.5 um/0.08 um while control transistor 130 may have a gate aspect ratio of 20 um/0.24 um. A 3.3V programming voltage then places programmable transistor 310 in snapback mode without doing the same for control transistor 330, and the resulting high current flow that shorts out transistor 310 will not reach the breakdown current level of transistor 330.

Figure 3B:
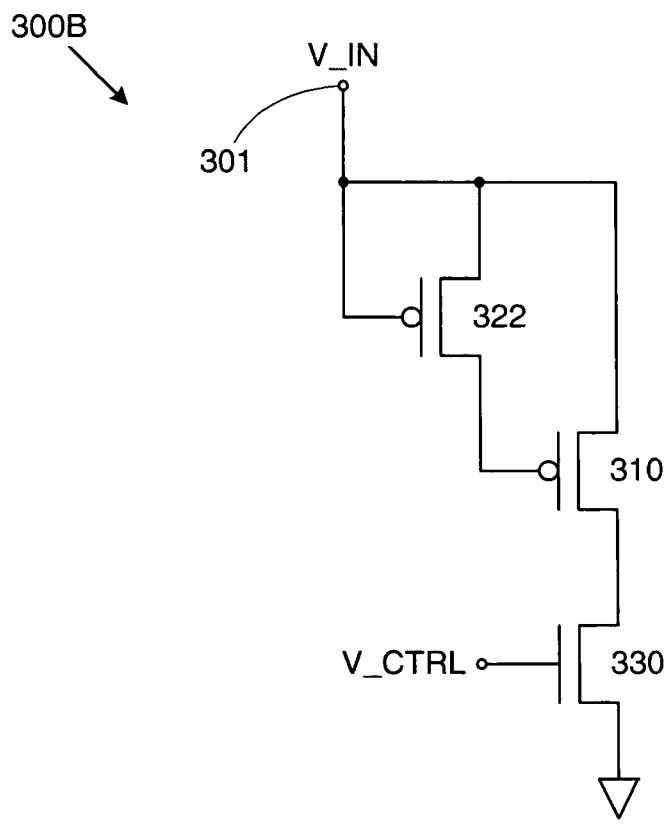

FIG. 3B shows an electrically programmable fuse 300B in accordance with another embodiment of the invention. Fuse 300B is substantially similar to fuse 300A shown in FIG. 3A, with resistive element 321 of fuse 100A being implemented as a gate-source coupled PMOS transistor 322 in fuse 300B. Gate-source coupled transistor 322 provides a very high resistance path (e.g., in the mega-Ohm range) between the gate of programmable transistor 310 and the high voltage input terminal 301. Typically, gate-source coupled transistor 322 can be implemented much more easily and efficiently than a conventional semiconductor resistor, and therefore can reduce the cost and space requirements of fuse 300B.

Fuse 300B operates in a manner substantially similar to that described with respect to fuse 300A. Transistor 322 weakly pulls the gate of programmable transistor 310 to a high voltage to ensure that a low read current is maintained while transistor 310 is unprogrammed. The application of an elevated programming voltage to input terminal 301 results in capacitive coupling between the drain and gate of transistor 310. Due to the high resistance of grounded-gate transistor 322, this capacitive coupling results in a gate voltage that is less than the programming voltage, which begins to turn on transistor 310. Consequently, the snapback voltage of transistor 310 is reduced, thereby ensuring that transistor 310 is placed into snapback mode by the programming voltage and eventually "blows". Once programmed in this manner, transistor 310 will always provide a high read current at input terminal 301.

The various embodiments of the structures and methods of this invention that are described above are illustrative only of the principles of this invention and are not intended to limit the scope of the invention to the particular embodiments described. Thus, the invention is limited only by the following claims and their equivalents.

We claim:

1. An electrically programmable fuse comprising:
    a first metal-oxide-semiconductor (MOS) transistor, the first MOS transistor having a nominal snapback voltage, wherein the first MOS transistor comprises a first n-type MOS (NMOS) transistor, wherein the source of the first MOS transistor is connected to ground; and
    a regulating element coupled between a gate of the first MOS transistor and a source of the first MOS transistor for lowering a snapback voltage of the first MOS transistor below the nominal snapback voltage, wherein the regulating element is a resistive element comprising a second NMOS transistor, wherein a drain of the second NMOS transistor is connected to the gate of the first MOS transistor, and wherein a source of the second NMOS transistor and a gate of the second NMOS transistor are connected to ground.

2. The electrically programmable fuse of claim 1, further comprising a third MOS transistor, the third MOS transistor being coupled to provide a programming voltage to the drain of the first MOS transistor, the programming voltage being greater than a nominal operating voltage of the first MOS transistor.

3. The electrically programmable fuse of claim 2, wherein the third MOS transistor comprises a p-type MOS (PMOS) transistor, wherein a drain of the PMOS transistor is connected to the drain of the first MOS transistor, and wherein a source of the PMOS transistor is coupled to receive the programming voltage.

4. The electrically programmable fuse of claim 2, wherein the first MOS transistor and the second NMOS transistor comprise high speed transistors, and wherein the third MOS transistor comprises a high voltage transistor.

5. The electrically programmable fuse of claim 2, wherein the first MOS transistor has a gate aspect ratio of approximately 0.5 um/0.08 um and the third MOS transistor has a gate aspect ratio of approximately 40 um/0.24 um.

6. An electrically programmable fuse comprising:
a first metal-oxide-semiconductor (MOS) transistor, the first MOS transistor having a nominal snapback voltage, wherein the first MOS transistor comprises a first p-type MOS (PMOS) transistor;
an n-type MOS (NMOS) transistor, the NMOS transistor being coupled between a drain of the first MOS transistor and ground; and
a regulating element coupled between a gate of the first MOS transistor and a source of the first MOS transistor for lowering a snapback voltage of the first MOS transistor below the nominal snapback voltage, wherein the regulating element is a resistive element comprising a second PMOS transistor, wherein a drain of the second PMOS transistor is connected to the gate of the first MOS transistor, and wherein a source of the second PMOS transistor and a gate of the second PMOS transistor are connected to the source of the first MOS transistor.

7. The electrically programmable fuse of claim 6, wherein the first MOS transistor and the second PMOS transistor comprise high speed transistors, and
wherein the NMOS transistor comprises a high voltage transistor.

8. An integrated circuit (IC) comprising:
a first metal-oxide-semiconductor (MOS) transistor designed for a nominal operating voltage, the first MOS transistor having a nominal snapback voltage, wherein the first MOS transistor comprises a first n-type MOS (NMOS) transistor, wherein the source of the first MOS transistor is connected to ground;
a regulating element coupled between a gate of the first MOS transistor and a source of the first MOS transistor for lowering a snapback voltage of the first MOS transistor below the nominal snapback voltage, wherein the regulating element is a resistive element comprising a second NMOS transistor, wherein a drain of the second NMOS transistor is connected to the gate of the first MOS transistor, and wherein a source of the second NMOS transistor and a gate of the second NMOS transistor are connected to ground; and
a control circuit for selectively providing the nominal operating voltage and a programming voltage to the first MOS transistor, the programming voltage being greater than the nominal operating voltage, wherein the control circuit is connected to a drain of the first MOS transistor.

9. The IC of claim 8, wherein the control circuit comprises a p-type MOS (PMOS) transistor, a drain of the PMOS transistor being connected to the drain of the first MOS transistor, and a source of the PMOS transistor being coupled to receive the programming voltage.

10. The IC of claim 9, wherein the first NMOS transistor and the second NMOS transistor comprise high speed transistors, and wherein the PMOS transistor comprises a high voltage transistor.

11. The IC of claim 8, wherein the first MOS transistor comprises a first p-type MOS (PMOS) transistor, wherein the source of the first MOS transistor is connected to the control circuit,
wherein a drain of the first MOS transistor is coupled to ground by an n-type MOS (NMOS) transistor, and
wherein the regulating element is a resistive element.

12. The IC of claim 11, wherein the resistive element comprises a polysilicon resistor.

13. The IC of claim 11, wherein the resistive element comprises a second PMOS transistor,
wherein a drain of the second PMOS transistor is connected to the gate of the first MOS transistor, and
wherein a source of the second PMOS transistor and a gate of the second PMOS transistor are connected to the source of the first MOS transistor.

14. The IC of claim 13, wherein the first PMOS transistor and the second PMOS transistor comprise high speed transistors, and
wherein the NMOS transistor comprises a high voltage transistor.

15. The IC of claim 8, wherein the IC comprises a programmable logic device, further comprising:
a configurable resource, wherein the configurable resource is selectively enabled responsive to a read current of the first MOS transistor.

16. A method for programming a first metal-oxide-semiconductor (MOS) transistor in an integrated circuit (IC), the method comprising:
providing a regulating element coupled between a gate of the first MOS transistor and a source of the first MOS transistor, wherein the first MOS transistor comprises a first n-type MOS (NMOS) transistor, and wherein the regulating element comprises a second NMOS transistor, a drain of the second NMOS transistor being connected to the gate of the first MOS transistor, and a source of the second NMOS transistor and a gate of the second NMOS transistor being connected to ground;
applying a programming voltage across the first MOS transistor to place the first MOS transistor in snapback mode; and
operating the first MOS transistor in snapback mode until thermal breakdown of the first MOS transistor occurs.

17. An electrically programmable fuse comprising:
a first metal-oxide-semiconductor (MOS) transistor having a source terminal coupled to a voltage supply; and
a regulating element coupled between a gate terminal of the first MOS transistor and the source terminal of the first MOS transistor:
wherein the first MOS transistor is permanently shorted such that current flows between the source terminal of the first MOS transistor and a drain terminal of the first MOS transistor regardless of a gate voltage applied at the gate terminal of the first MOS transistor;
wherein the regulating element comprises a second MOS transistor having a gate terminal, a source terminal, and a drain terminal;
wherein the drain terminal of the second MOS transistor is coupled to the gate terminal of the first MOS transistor; and
wherein the source terminal of the second MOS transistor and the gate terminal of the second MOS transistor are coupled to the voltage supply.

18. The electrically programmable fuse of claim 17, wherein each of the first and second MOS transistors comprises an n-type MOS (NMOS) transistor.

19. The electrically programmable fuse of claim 17, wherein each of the first and second MOS transistors comprises a p-type MOS (PMOS) transistor.

20. The electrically programmable fuse of claim 17, further comprising a third MOS transistor having a drain terminal;
   wherein the drain terminal of the third MOS transistor is coupled to the drain terminal of the first MOS transistor.

21. The electrically programmable fuse of claim 20, wherein:
   each of the first and second MOS transistors comprises an n-type MOS (NMOS) transistor; and
   the third MOS transistor comprises a p-type MOS (PMOS) transistor.

22. The electrically programmable fuse of claim 20, wherein:
   each of the first and second MOS transistors comprises a p-type MOS (PMOS) transistor; and
   the third MOS transistor comprises an n-type MOS (NMOS) transistor.

* * * * *